(12) United States Patent
Hutton et al.

(10) Patent No.: US 7,639,007 B2
(45) Date of Patent: Dec. 29, 2009

(54) APPARATUS AND METHOD FOR PERFORMING IN-VITRO DNP-NMR MEASUREMENTS

(75) Inventors: Graham Mark Hutton, Oxford (GB); Robert Andrew Slade, Oxon (GB); Francis John Brown, Oxon (GB)

(73) Assignee: Oxford Instruments Superconductivity Ltd., Oxon (GB)

( * ) Notice: Subject to any disclaimer, the term of this patent is extended or adjusted under 35 U.S.C. 154(b) by 441 days.

(21) Appl. No.: 11/569,130

(22) PCT Filed: May 16, 2005

(86) PCT No.: PCT/GB2005/001873

§ 371 (c)(1),
(2), (4) Date: Nov. 15, 2006

(87) PCT Pub. No.: WO2005/114244

PCT Pub. Date: Dec. 1, 2005

(65) Prior Publication Data

US 2008/0290869 A1    Nov. 27, 2008

(30) Foreign Application Priority Data

May 18, 2004    (GB)    ................... 0411072.2

(51) Int. Cl.
*G01V 3/00*    (2006.01)
(52) U.S. Cl. ...................... 324/307; 324/321
(58) Field of Classification Search ................. 324/307, 324/309, 321
See application file for complete search history.

(56) References Cited

U.S. PATENT DOCUMENTS

| 6,515,260 | B1 | 2/2003 | Anderson | |
| 7,183,769 | B2* | 2/2007 | Kasten et al. | 324/318 |
| 7,492,154 | B2* | 2/2009 | Lucas et al. | 324/309 |

FOREIGN PATENT DOCUMENTS

WO    02/37132 A1    5/2002

(Continued)

OTHER PUBLICATIONS

PCT Search Report dated Oct. 31, 2005 of Patent Application No. PCT/GB2005/001873 filed May 16, 2005.

(Continued)

*Primary Examiner*—Louis M Arana
(74) *Attorney, Agent, or Firm*—Vern Maine & Associates (57) ABSTRACT

Apparatus for performing in-vitro DNP-NMR measurements on a sample comprises magnetic field generating apparatus (1*a*, 1*b*) located in a cryostat (2) and surrounding a bore defining respective NMR and DNP working regions (90, 92). A system for performing DNP on a suitably prepared sample in the DNP working region. A system for performing a NMR process on a sample in the NMR working region. A sample positioning mechanism (5) which can be inserted in the bore (3) to bring a sample in turn into each of the working regions. The magnetic field generating apparatus is suitably structured so that the magnetic field in the DNP working region has a homogeneity or profile suitable for performing DNP on the sample and the magnetic field in the NMR working region has a homogeneity or profile suitable for performing a NMR process on the sample.

18 Claims, 10 Drawing Sheets

FOREIGN PATENT DOCUMENTS

WO            03/040742 A1    5/2003

OTHER PUBLICATIONS

Lurie et al., "Design, Construction and Use of a Large-Sample Field-Cycled PEDRI Imager", Phys. Med. Biol. 43, 1998, pp. 1877-1886.

Farrar, C.T. et al., "Mechanism of Dynamic Nuclear Polarization in High Magnetic Fields", Journal of Chemical Physics, 2001, pp. 4922-4933, vol. 114, No. 11.

* cited by examiner

APPARATUS AND METHOD FOR PERFORMING IN-VITRO DNP-NMR MEASUREMENTS

FIELD OF INVENTION

The invention relates to apparatus and methods for performing in-vitro DNP-NMR measurements on a sample.

BACKGROUND

The widespread commercial application of NMR (nuclear magnetic resonance) spectroscopy has been somewhat restricted by the inherent low sensitivity of the technique. This is particularly true for $^{13}$C and $^{15}$N nuclei, due to their low magnetic moments and natural abundance compared to $^1$H. The signal to noise ratio (SNR) of NMR may be improved by reducing thermal noise or enhancing signal. The former approach has recently seen increased use through the widespread commercial availability of cryogenically cooled RF probes, despite the fact that it only affords a SNR gain of perhaps a factor five under ideal circumstances. NMR signal increases with magnetic field strength, which is one of the reasons behind the trend for development of ever higher field magnets, but this is an exceptionally costly solution to improved SNR.

An alternative method of boosting signal is dynamic nuclear polarization (DNP). In the absence of an applied magnetic field, nuclei having magnetic moment μ (ie: non-integer spin) will be randomly aligned. When placed in a magnetic field the nuclei will align parallel (spin-up) or anti-parallel (spin-down) with the field (of flux density B). The bulk polarization P of a sample may be determined from the ratios of spin-up and spin-down populations, and is related to the ratio of magnetic and thermal energy:

$$P = \tanh\left(\frac{\mu \cdot B}{k \cdot T}\right)$$

where T is temperature and k is Boltzmann's constant.

The thermal equilibrium polarization is very weak even in a strong magnetic field. For example, $^1$H polarization is only 32 ppm at room temperature in a 9.4 T field, and $^{13}$C is only 8 ppm. The great attraction of hyperpolarization is the ability to temporarily increase the polarization substantially above the equilibrium level, and make an NMR measurement before the enhanced polarization decays back to equilibrium. Several techniques for achieving hyperpolarization have been reported, but most have technical restrictions which limit their application to specific niche markets (e.g.: hyperpolarized $^{129}$Xe gas lung imaging). "Increase in signal-to-noise ratio of >10000 times in liquid-state NMR", J H Ardenkjaer-Larsen et al, PNAS Vol 100.#18, Feb. 9, 2003 demonstrates a process for hyperpolarizing a wide range of small molecule compounds in liquid solution, from which enhanced NMR spectra may be obtained. The process broadly follows the steps of:

1. Mixing a polarizing agent (a compound containing a free radical, ie: unpaired electron) with the sample. A cryoprotectant such as glycol is usually also added.
2. Cooling the mixture to a low temperature where the electron spin polarization is substantial (>50%), typically using a liquid helium bath pumped to 1-2K.
3. Placing the sample in a strong, homogeneous magnetic field (typically a few Tesla, generated by a superconducting magnet, typically sharing the same cryostat as the sample cooling apparatus). At this temperature and field the electron polarization approaches 100%.
4. Irradiating the frozen sample with microwave radiation at a frequency chosen to excite electron spin resonance (ESR) and cause exchange of energy between the nuclear and electron spin systems, via a complex combination of spin-exchange processes (e.g.: Nuclear Overhauser effect, Solid Effect and Thermal Mixing). Over a period of minutes to hours the irradiation results in a build-up of nuclear polarization to a level significantly enhanced over the equilibrium level (e.g.: several %). In essence polarization is transferred from the electron spin system to the nuclear spin system.
5. Turning off the microwave radiation.
6. Rapidly thawing the sample whilst still in a strong (but now not necessarily homogeneous) magnetic field, typically by dissolution in a hot solvent. If thawing is carried out in about a second or less it has been demonstrated that more than 50% of the hyperpolarization can be retained in the liquid state. This represents three to four orders of magnitude polarization enhancement over room temperature equilibrium.
7. Rapidly transferring the liquid sample to a conventional NMR magnet and acquiring a spectrum in a single shot measurement (e.g.: by a conventional pulse-acquire experiment).

As an alternative to freezing and dissolving, the sample could be melted.

The hyperpolarization $P_{DNP}$ of the target nucleus achieved after irradiation for a time t is approximately:

$$P_{DNP}(t) = \eta \cdot \tanh\left(\frac{\mu_e \cdot B}{k \cdot T}\right) \cdot (1 - e^{\frac{-t}{\tau}})$$

where η is a DNP efficiency factor defining the efficiency of transfer of electron polarization (with moment $\mu_e$) to the target nucleus ($\mu_n$), and τ is the hyperpolarization build-up time constant. (η and τ are dependant on many factors, such as T and B).

To achieve a significant signal enhancement it is vital that the sample thawing and NMR measurement steps occur very rapidly. This process must also be very well controlled if good data repeatability is to be achieved. The reasons are as follows. When the microwave irradiation is turned off (at time $t_0$) the hyperpolarization decays back towards its thermal equilibrium level. Because the equilibrium polarization is so small compared to the hyperpolarization, the following expression adequately describes the decay of hyperpolarization after microwave irradiation has ceased:

$$P(t-t_0) = P_{DNP}(t_0) \cdot e^{\frac{-(t-t_0)}{T1}}$$

The time constant of the decay (T1) is determined primarily by the sample's temperature and the magnetic field to which it is exposed. [T1 also depends on the chemical environment of the nucleus, due to dipole-dipole coupling effects]. In the solid state T1 is related to T and B as:

$$T1 \propto B^\alpha / T^\beta$$

where α is about 2.5 and β is approximately 2. If the sample is kept frozen and cold in a relatively strong magnetic field the relaxation rate remains relatively long (typically minutes to hours).

After dissolution, T1 in the liquid state is much shorter than in the frozen state, but is less sensitive to temperature and magnetic field. It has been demonstrated that the hyperpolarization will persist for several seconds even at room temperature in the Earth's field.

There are therefore two basic options for DNP-NMR hardware: to move the sample from polarization region to the NMR measurement region as a solid, or as a liquid. In the latter case it is possible to transfer the dissolved sample from a dedicated polarizing magnet to a conventional NMR magnet, as described in the paper by J H Ardenkjaer-Larsen et al, referenced above, as long as the transfer is as fast as possible (a few seconds). However, in the apparatus described in that paper, there is a significant delay and variability caused by the manual transfer of the liquid sample from the polarizing apparatus to the NMR magnet.

If the sample is to be transferred as a solid it is necessary to keep it cold (typically <10K) and in a relatively strong magnetic field (typically >0.1 T). This requires either that these regions are positioned in close proximity, for example within the bore of a single magnet providing both polarization and NMR magnetic field regions, or that an insulated transfer magnet is provided to carry the frozen sample from the separate polarization magnet to the NMR magnet. These solutions are mentioned in the prior art, discussed below.

WO-A-03/023432 and WO-A-02/37132 describe several options for apparatus to carry out the DNP-NMR process with improved performance and repeatability, including making the NMR measurement within the same apparatus as that in which the hyperpolarization was performed. This approach has the advantage of minimising the time taken to transfer the polarized sample from the polarizing region to the measuring region.

The fastest possible "transfer" could be achieved if hyperpolarization and NMR measurement occur in the same position, i.e.: within the same uniform magnetic field region. Whilst this approach has been adopted by one research group for solid-state NMR ("Mechanism of Dynamic Nuclear Polarization in High Magnetic Fields," C. T. Farrar, D. A. Hall, G. J. Gerfen, S. J. Inati and R. G. Griffin, J. Chem. Physics 114, 4922-4933, 2001), it is generally not especially desirable for two main reasons:

1. The field strength required for NMR is typically 7 T or greater (to achieve sufficient frequency dispersion in the $^1$H spectrum), whilst that required for DNP is typically less than 3.5 T (because hardware for supplying sufficient microwave power is generally not available or cost effective above 100 GHz, the ESR frequency at 3.5 T).
2. The practical difficulties of packaging the sample cooling, microwave cavity and high-resolution NMR probe to fit within a single uniform field region, and ensuring that they do not interfere with each other whilst maintaining good performance.

It is therefore desirable that the polarizing and NMR field regions have properties individually tailored to their function, but are closely located, preferably within the same apparatus. This fact is recognised in WO-A-0237132, where the suggestion is made that the fringe field of conventional NMR magnet be shimmed to the required homogeneity. However, this is impractical for several reasons:

the amp-turns required to locally shim the fringe field cannot be generated by a conventional superconducting shim     the forces generated between a superconducting shim and the main magnet would be unacceptable     the superconducting shim would destroy the homogeneity of the NMR field region.

U.S. Pat. No. 6,515,260 also describes apparatus in which there are two separate magnetic field regions within the same magnet bore. The sample is hyperpolarized in one and moved rapidly to the second for NMR measurement. In this apparatus the sample is melted by the application of heat after moving from the polarizing region; no dissolution occurs. However, U.S. Pat. No. 6,515,260 does not describe how to achieve this apparatus in practice, i.e.: how to generate two uniform magnetic field regions in close proximity.

There is therefore a need to construct an improved apparatus able to carry out in-vitro DNP-NMR processes efficiently and in a commercially viable manner.

SUMMARY OF THE INVENTION

In accordance with a first aspect of the present invention, apparatus for performing in-vitro DNP-NMR measurements on a sample comprises magnetic field generating apparatus located in a cryostat and surrounding a bore defining respective NMR and DNP working regions; a system for performing DNP on a suitably prepared sample in the DNP working region; a system for performing a NMR process on a sample in the NMR working region; a sample positioning mechanism which can be inserted in the bore to bring a sample in turn into each of the working regions, the magnetic field generating apparatus being suitably structured so that the magnetic field in the DNP working region has a homogeneity or profile suitable for performing DNP on the sample and the magnetic field in the NMR working region has a homogeneity or profile suitable for performing a NMR process on the sample.

In accordance with a second aspect of the present invention, a method of performing in-vitro DNP-NMR measurements on a sample using apparatus according to the first aspect of the invention comprises preparing the sample for the DNP process; using the sample positioning mechanism to insert the sample into the DNP working region; carrying out DNP on the sample; using the sample positioning mechanism rapidly to transfer the sample to the NMR working region; dissolving the sample in solvent or melting the sample; and performing an NMR measurement on the sample.

We have realised that it is important to locate the two working regions as close together as possible so as to minimise loss of polarisation etc. This can be achieved using a single magnet assembly, suitably structured, or a pair of magnet assemblies located in the cryostat and surrounding respective, coaxial bores so as to define the corresponding NMR and DNP working regions in the bores, wherein the magnet assemblies are suitably shielded so that the magnetic field in the DNP working region has a homogeneity or profile suitable for performing DNP on the sample and the magnetic field in the NMR working region has a homogeneity or profile suitable for performing a NMR process on the sample. In the latter case, despite the fact that high field strengths are required within the working regions, it is possible to locate the two magnet assemblies close together by the use of suitable shielding. In particular, the use of suitable shielding minimises the reaction forces between the magnet assemblies, the influence of the stray or external fringe field from one magnet assembly on the magnitude of the central field of the other, and the influence of the gradients within the stray or external fringe field from one magnet assembly on the field uniformity (homogeneity) of the other.

Two shielding methods are available, passive by means of ferromagnetic material or active by means of reverse energised coil sets positioned within the individual magnet coil assemblies so as to reduce the stray or external fringe field from the main magnet. These coils can be considered to shape the fringe fields that exist between two (or more) magnets in close proximity so as to reduce the magnetic influence one on the other. Active shielding is preferred because it reduces the weight of the assemblies and can shield a variety of fields generated by the magnet assemblies.

We have found, in particular, that in order to reduce the influence of the two magnet assemblies on each other, in most cases active, end shielding coils should be provided. End shielding coils have most influence close to the magnetic axis and act over relatively short axial distances. In contrast conventional outer shielding coils act over regions more remote from the magnet. The combination of end and outer shielding coils, when correct combinations are applied significantly reduces the stray field.

We have also realised that an important factor determining a condition when the influence of the two magnet assemblies on each other is acceptable is that the external fringe field generated by each magnet assembly is ideally no greater than 0.0005 T at the centre of the working region defined by the other magnet assembly with the reversed energised active shielding coils in place.

In general, the two magnet assemblies will be electrically separate and separately powered but in some cases could be electrically connected in series so as effectively to define a single magnet but with two working regions.

Although most embodiments utilize just two working regions, more than two could be provided by suitably designing the magnetic field generating apparatus.

An important aspect of the present invention is that the sample can be moved from the cold polarizing region to a relatively warmer (preferably room temperature) region before dissolution. Hence the sample is moved whilst frozen. As described above, a significant proporation of the hyperpolarization will be retained if the sample is kept cold and within a relatively strong magnetic field (>0.1 T), and is moved quickly (~seconds). This is the case in the preferred embodiment of the present invention (in which the sample moves through a minimum field of ~0.3 T between the two magnets).

The simplest way to achieve the sample movement in a repeatable fashion is to place it within a container which is attached to a rigid rod or tube that extends along the magnet bore to an actuator outside the magnet cryostat. The sample stays in the container for all stages of the DNP process.

In order sufficiently to cool the sample in the DNP working region, preferably the apparatus further comprises coolant such as liquid helium in the bore defining the DNP working region. This allows the sample to be very closely surrounded by liquid helium and thus its temperature reduced close to that of the liquid helium.

Various different methods will be described below for cooling the sample in the DNP working region.

BRIEF DESCRIPTION OF THE DRAWINGS

Some examples of methods and apparatus according to the invention will now be described with reference to the accompanying drawings, in which:—

DETAILED DESCRIPTION

Figure 1:
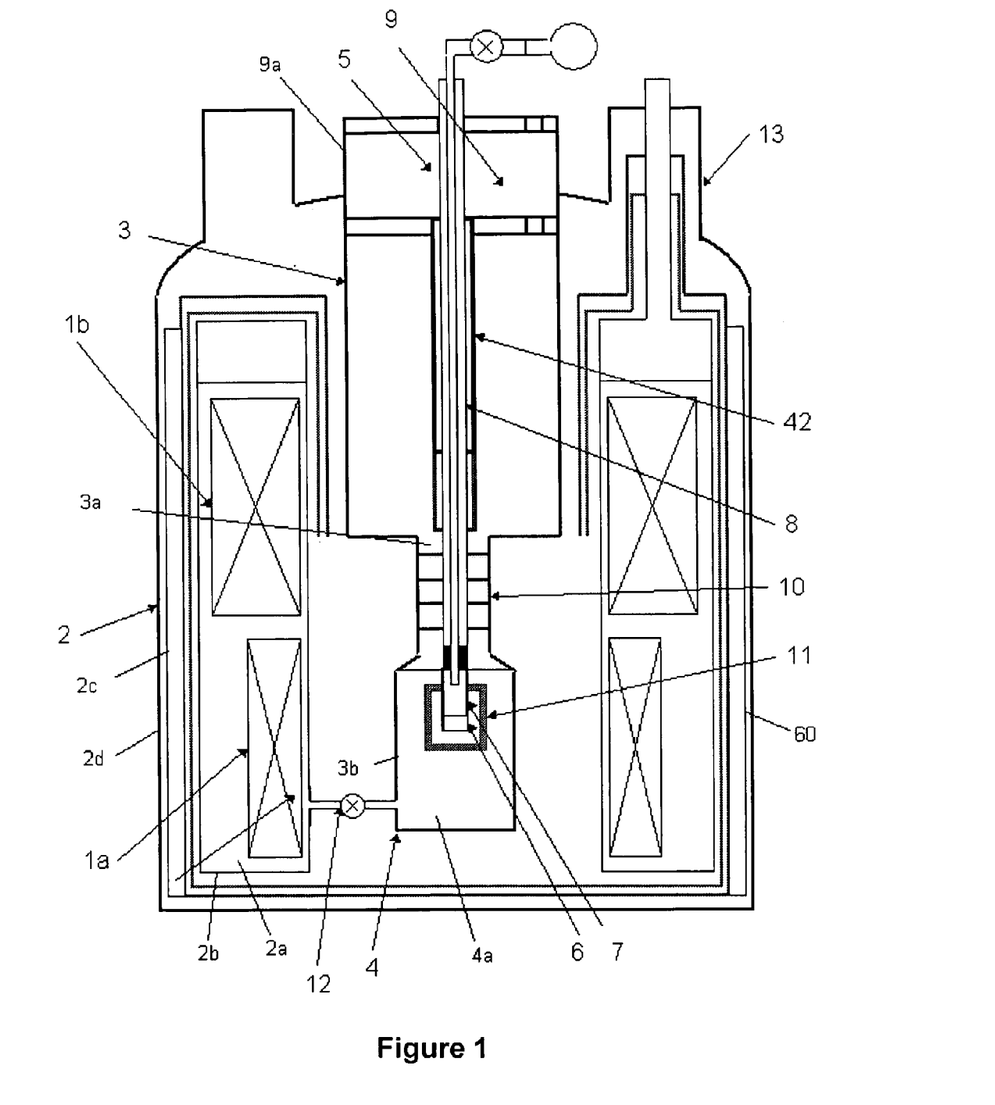
FIG. 1 illustrates in cross-section a first example of a combined DNP-NMR polarizing, dissolution and NMR measurement apparatus.

Referring to FIG. 1, the combined DNP-NMR apparatus comprises a polarizing magnet 1a, positioned below an NMR magnet 1b, inside a cryostat 2, having a room temperature bore 3 containing an access port 3a to a polarization chamber 4 within a coaxial bore 3b. A sample positioning assembly 5 is located in the bores 3,3b. This comprises a container 7 in which a sample 6 is located, the container being attached to the end of a positioning rod 8. The rod may be moved vertically within the bores to position the sample within the polarization chamber 4, an NMR RF probe 42, or to remove it from the bores into a sample changer apparatus 9. It will be recognised that other orientations of the magnets are possible.

The cryostat 2 is of conventional form and has an inner Helium can 2a surrounded by a radiation shield 2b, a nitrogen can 2c and an outer vacuum wall 2d.

When the sample is in the polarization chamber 4 it is immersed in liquid helium 4a. The polarization chamber has a neck 10 connecting to the bore 3 of the main cryostat. The bore is ideally filled with helium to prevent contamination of the polarization chamber with air when the sample positioning assembly is moved in and out. The polarization chamber 4 contains a polarization cell 11. The polarizing cell in turn comprises a microwave cavity to irradiate the sample, and an NMR polarimeter to monitor the build-up of hyperpolarization (not shown).

It will be understood that for clarity we have omitted the control arrangements needed to energise the various components needed to carry out the DNP and NMR processes since these will have a conventional form.

Figure 2:
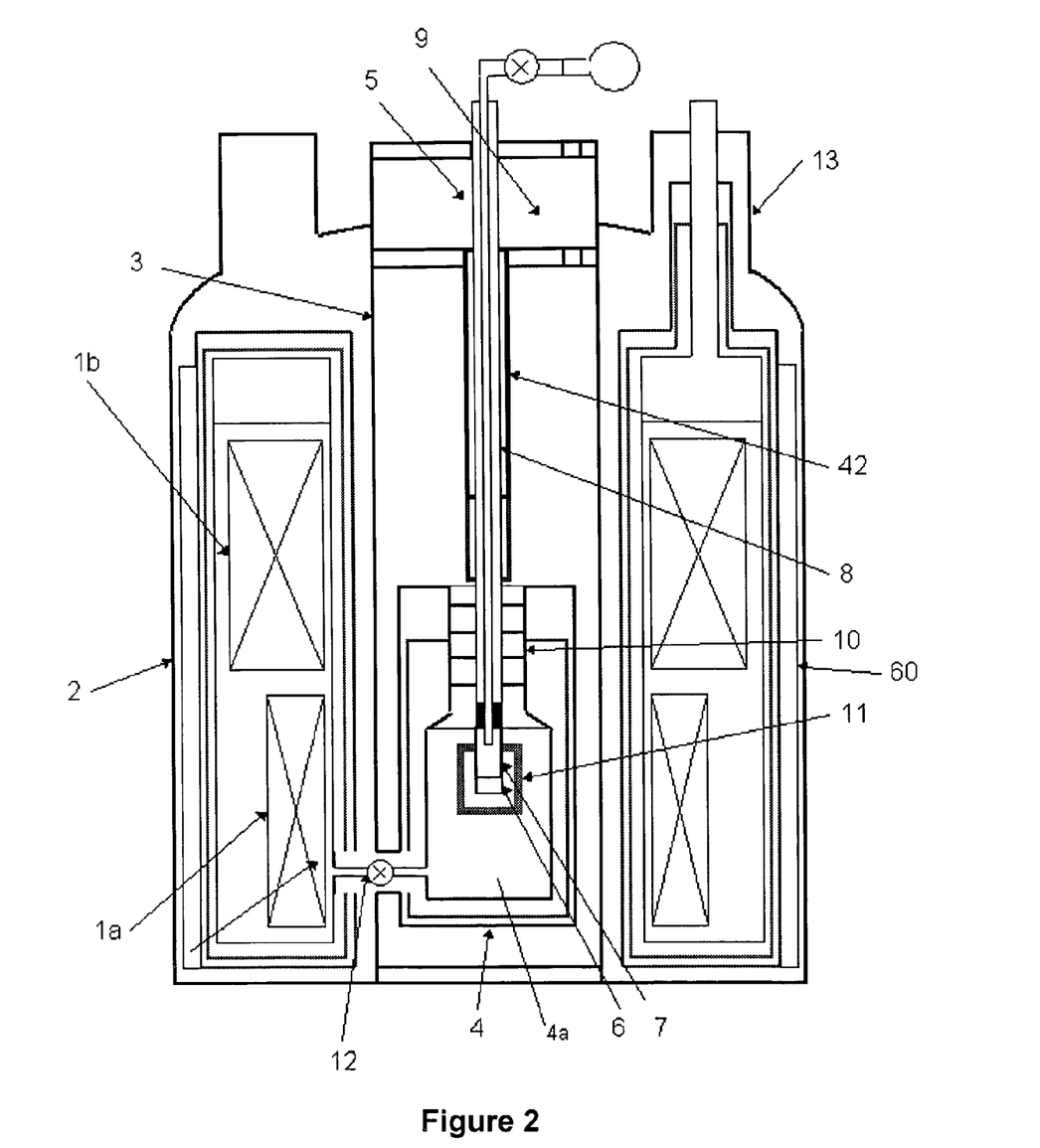
FIG. 2 illustrates in cross-section a second example of a combined DNP-NMR polarizing, dissolution and NMR measurement apparatus.

In an alternative embodiment shown in FIG. 2, the polarization chamber 4 has its own vacuum insulation and thermal shields, i.e.: it is a separate insert cryostat 4b within the room temperature bore of the magnet cryostat. This embodiment may be preferred for ease of maintenance and repair. The insert cryostat 4b may be refilled by a separate filling tube (not shown) or via a valve and transfer tube 12 from the main cryostat 2. The main cryostat is refilled via a conventional neck 13. The cryostat in the embodiments shown in FIGS. 1, 2 and 3 optionally has a liquid nitrogen jacket 60 for additional thermal shielding.

Figure 3:
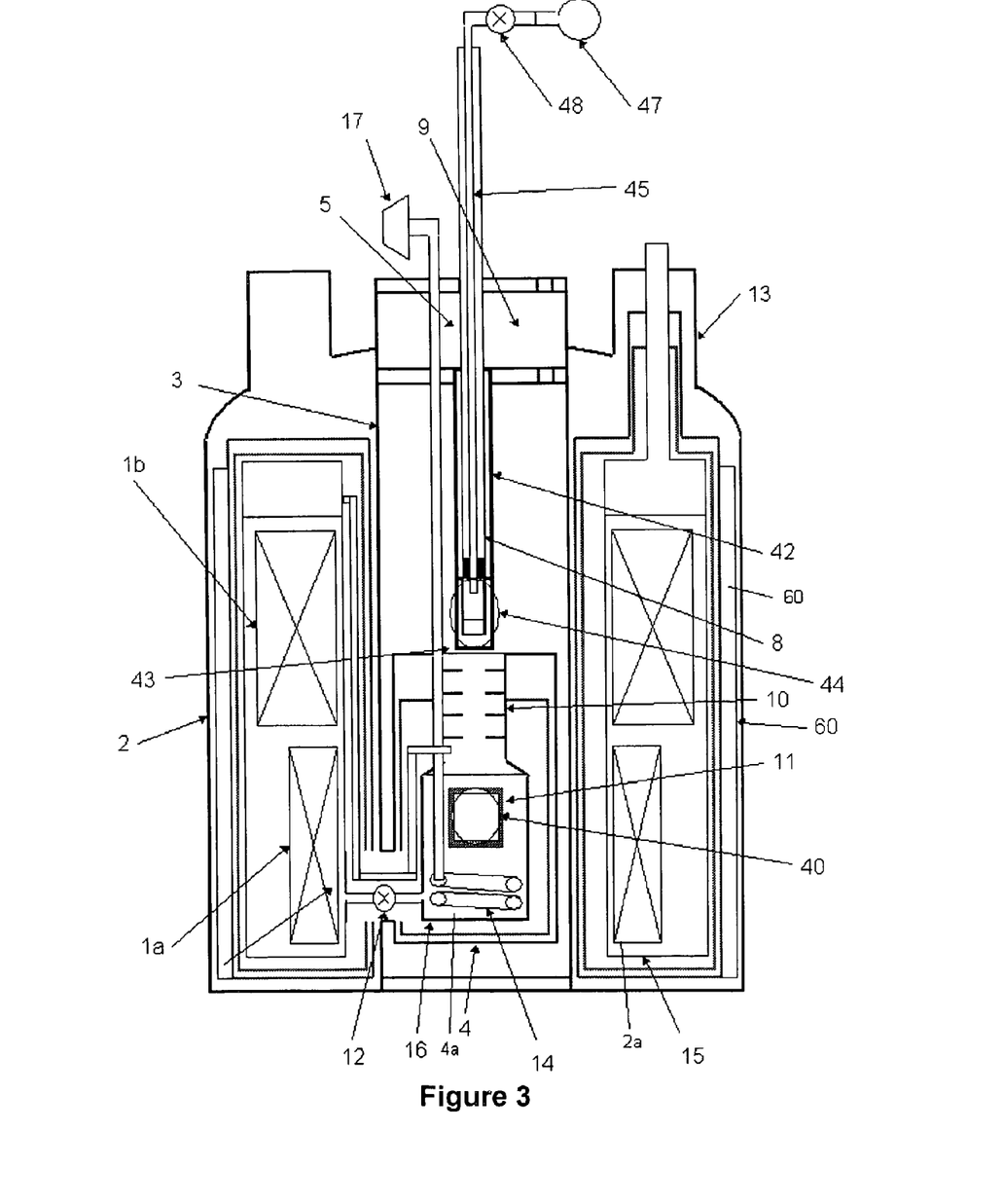
FIG. 3 illustrates in cross-section a third example of a combined DNP-NMR polarizing, dissolution and NMR measurement apparatus.
Figure 4:
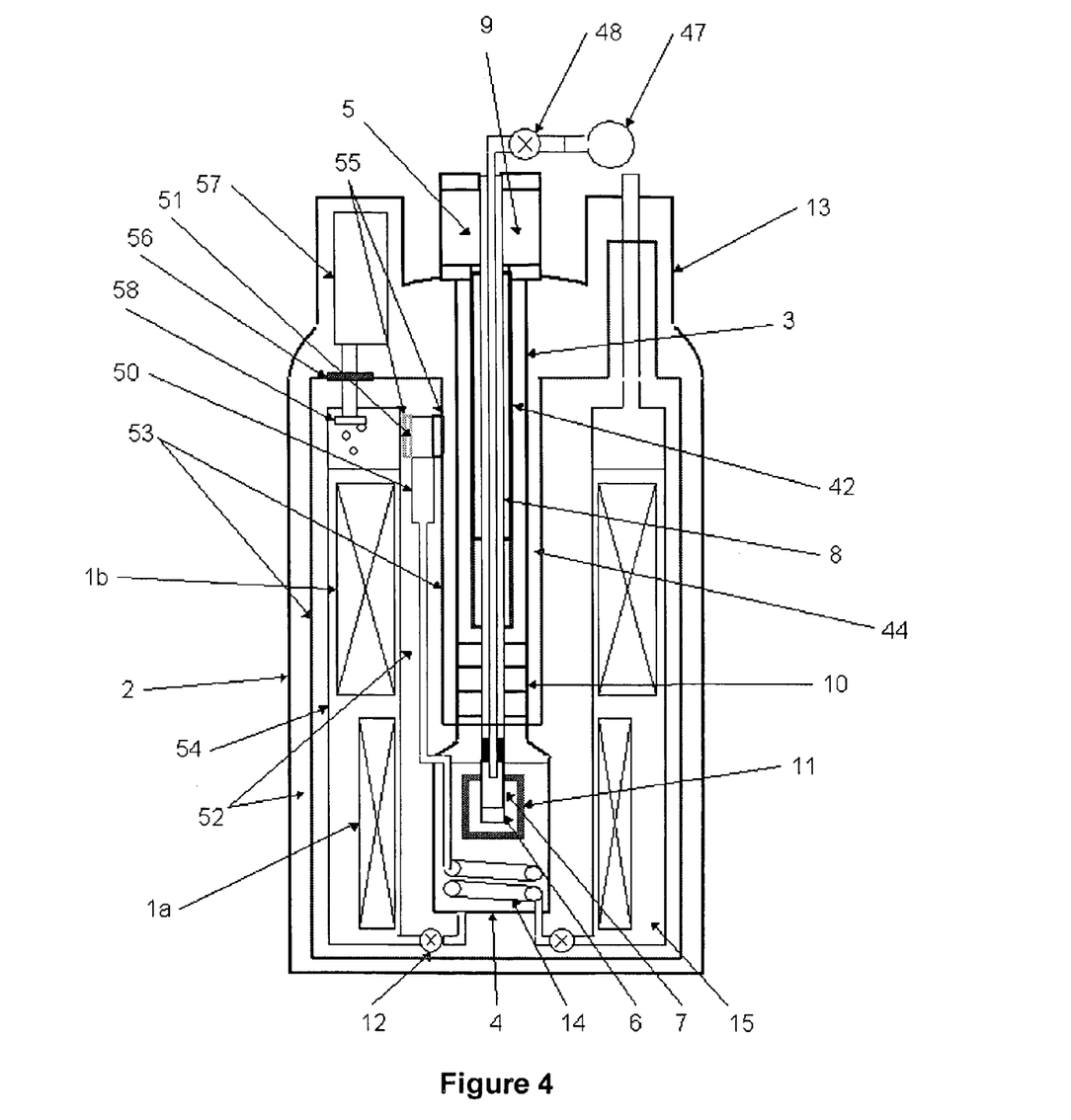
FIG. 4 illustrates in cross-section a fourth example of a combined DNP-NMR polarizing, dissolution and NMR measurement apparatus.

A disadvantage of the embodiments shown in FIGS. 1 to 3 is the requirement to occasionally re-fill the cryostat(s) with liquid helium. A pulse tube refrigerator may be used to recondense the boiled-off helium, as described in prior art. It can be difficult to implement re-condensing operation in a sub-cooled system due to the low pressure gas in the sub-cooling refrigerator. A solution involves using an adsorption pump to sub-cool the polarization chamber. This is shown in FIG. 4. An additional chamber 50 containing a strongly adsorptive material 51 (e.g.: fine carbon powder) is positioned within the main cryostat's vacuum space 52. This chamber may be thermally connected to either the thermal shield 53 or the magnet helium vessel 54 by means of heat switches 55. A heat switch is simply a chamber that can be evacuated or filled with a gas, (e.g.: helium) and hence has a low or high thermal conductivity. The first stage 56 of the PTR 57 is connected to the thermal shield (53, held at about 40K), whilst the second stage 58 sits within the vapour space of the magnet helium vessel, re-condensing boiled off vapour.

This apparatus allows the polarizing chamber to be sub-cooled during the polarization phase. The method of operation is as follows. During the sample polarization period the adsorption material 51 is thermally linked to the helium vessel by means of the switches (the one connected to the thermal shield is off, the other on) so that it cools and strongly adsorbs helium vapour, hence sub-cooling the polarization chamber. At the end of the polarization period the heat switches are both switched so that the adsorption material warms and expels the adsorbed helium in preparation for re-use. During this period the polarization chamber will gradually warm but the thermal shield will be strongly cooled. After a short period (determined by the thermal efficiency of the cryostat design and the cooling power of the PTR), during which the sample dissolution and NMR measurement can be conveniently carried out, the one-shot refrigeration system will be ready to repeat the polarization period for another sample. This arrangement has the great advantage of requiring no external pumps (other than the small pump required to operate the heat switches).

Figure 5:
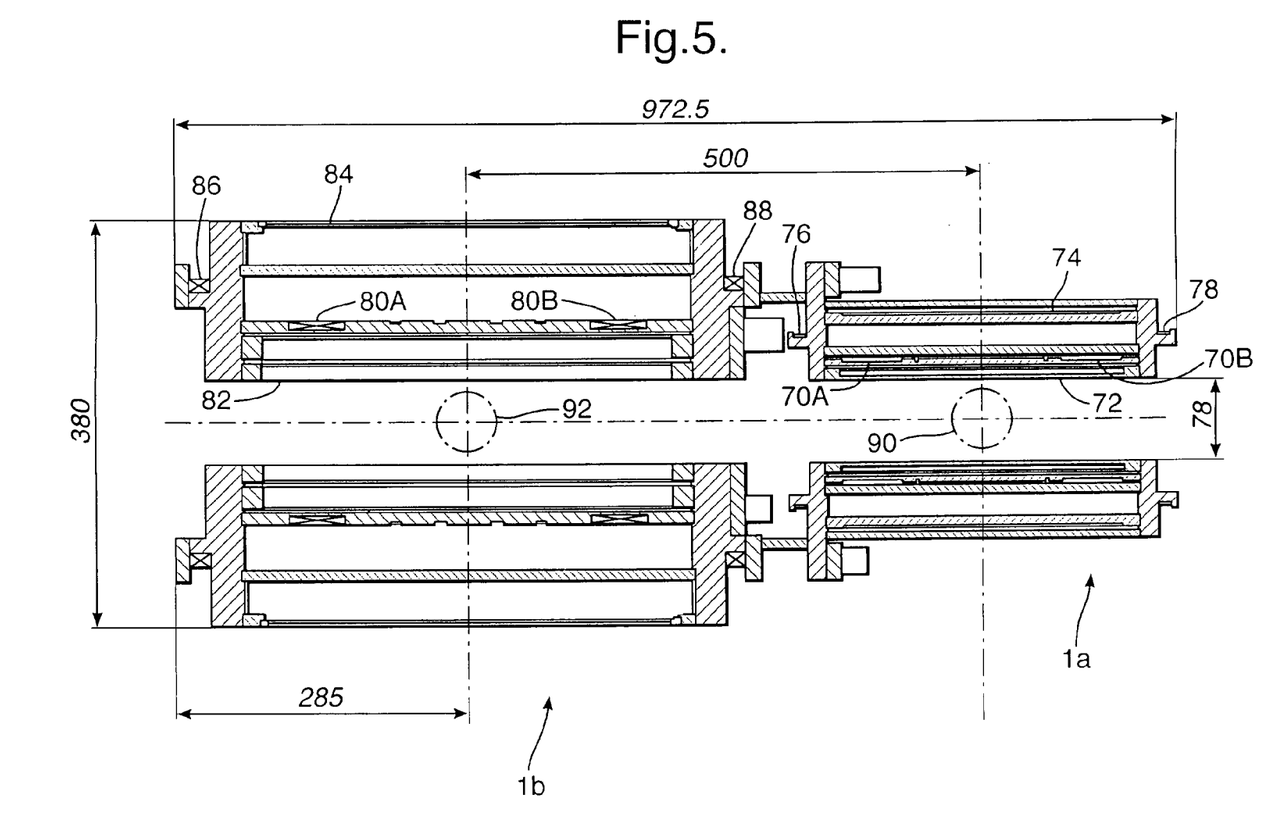
FIG. 5 is a representation of a typical DNP-NMR magnet arrangement showing overall dimensions in millimetres.

FIG. 5 illustrates a specific example of a pair of magnet assemblies which could be used in any of the examples shown in FIGS. 1 to 4. The magnet assembly 1a comprises an inner coil pair 70A,70B around a bore 72 having a diameter of 78 mm. The coil pair 70A,70B is encircled by an active shield solenoid 74 while end shield coils 76,78 are located coaxially with the coils 70A,70B,74 to achieve axial shielding. In a similar way, the magnet assembly 1b comprises main coil pairs 80A,80B located about a bore 82 coaxial with the bore 72 and having the same diameter as that bore. An active shield solenoid 84 extends about the coils 80A,80B while active shield end coils 86,88 provide axial shielding.

A DNP working volume 90 and an NMR working volume 92 are provided at the centre of the assemblies 1a,1b respectively.

As explained above, it is important to consider the interaction between the two magnet assemblies 1a,1b. The main interactions that must be considered are static forces between the magnets during operation, the effect of each on the other's homogeneity and the effect of one quenching and inducing dynamic currents and subsequent forces on the other. The first two interactions are reduced by the fact that the individual assemblies 1a,1b are both actively shielded. The quench interaction is reduced by protecting one (or both) of the magnets with a single protection resistor (not shown) such that the nett flux through the so protected magnet from the other magnet or its constituent coil is near zero. Minimising this flux linkage therefore minimises induced dynamic currents and subsequent forces. In this example, the magnet assembly 1b is a NMR magnet producing a 9.4 T field and having a 78 mm bore while the magnet assembly 1a is a 3.35 T hyperpolarising magnet. For this example the nett forces between the magnets is reduced to a few tens of Newtons and the homogeneity interaction is kept well within superconducting shim coil ranges (typically a few ppm over a the homogeneous volume.

Figure 6:
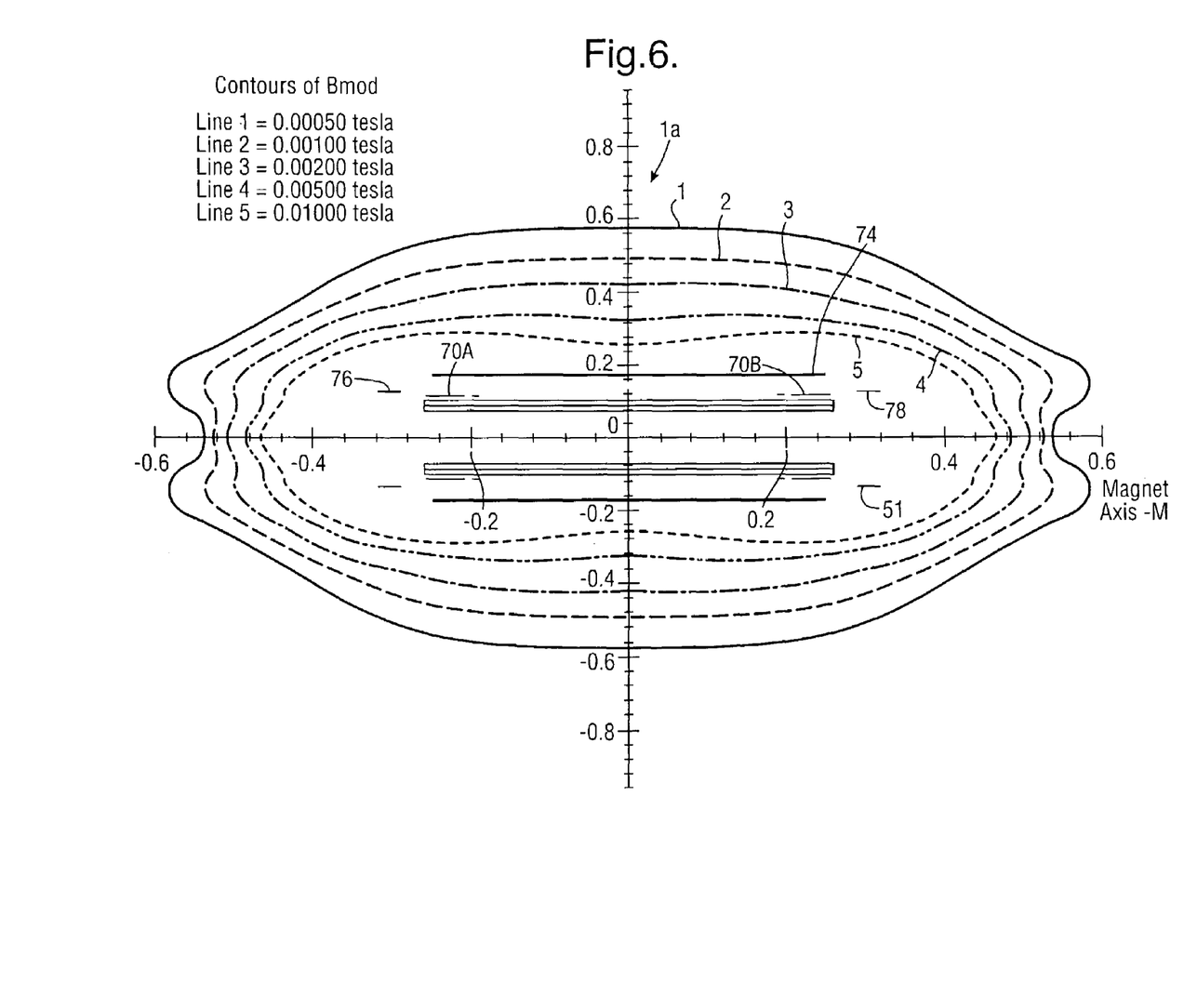
FIG. 6 is a contour map of the fringe field generated by the DNP magnet assembly alone in the FIG. 1 example.
Figure 7:
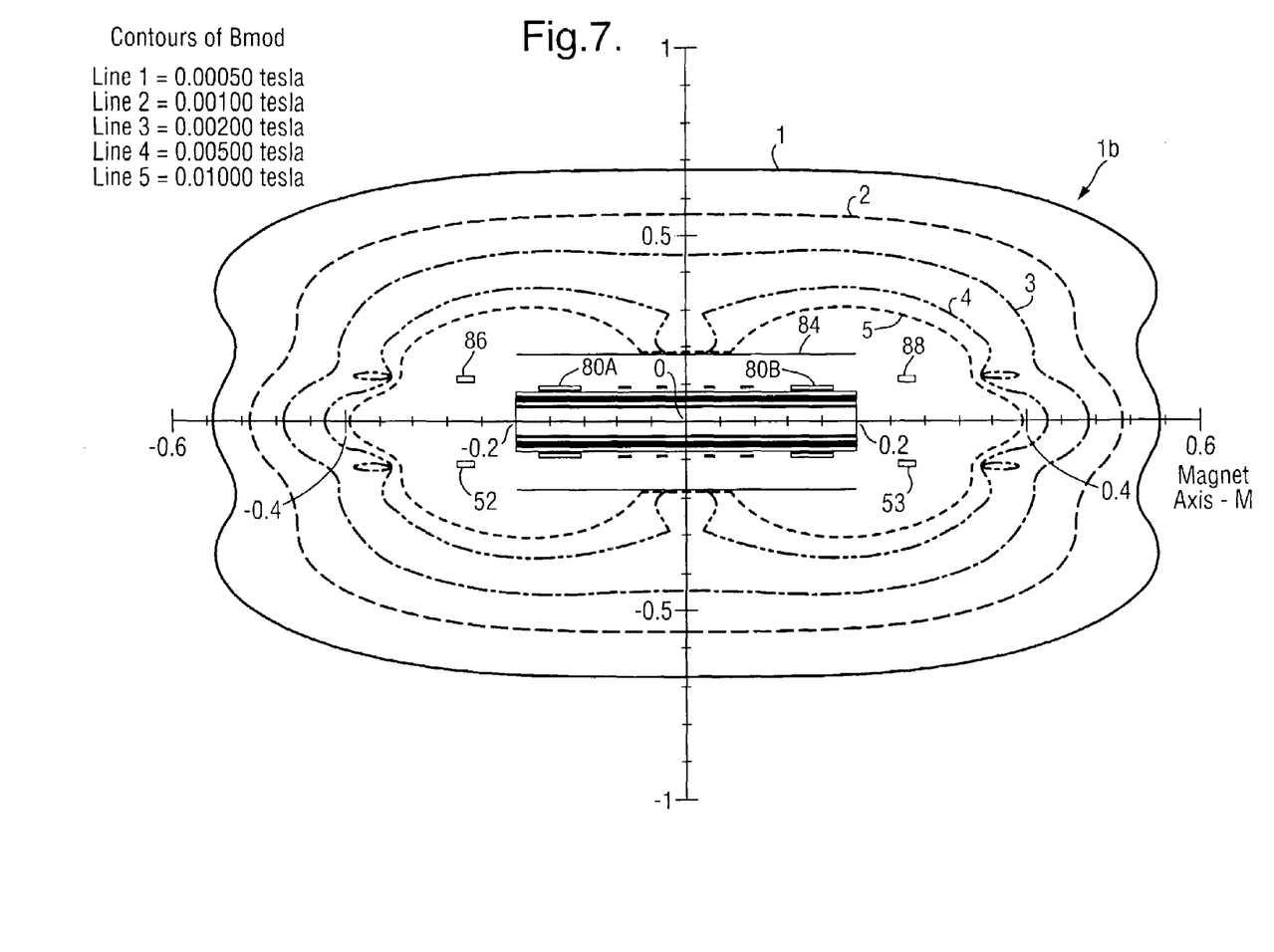
FIG. 7 is a contour map of the fringe field generated by the NMR magnet assembly alone in the FIG. 1 example.
Figure 8:
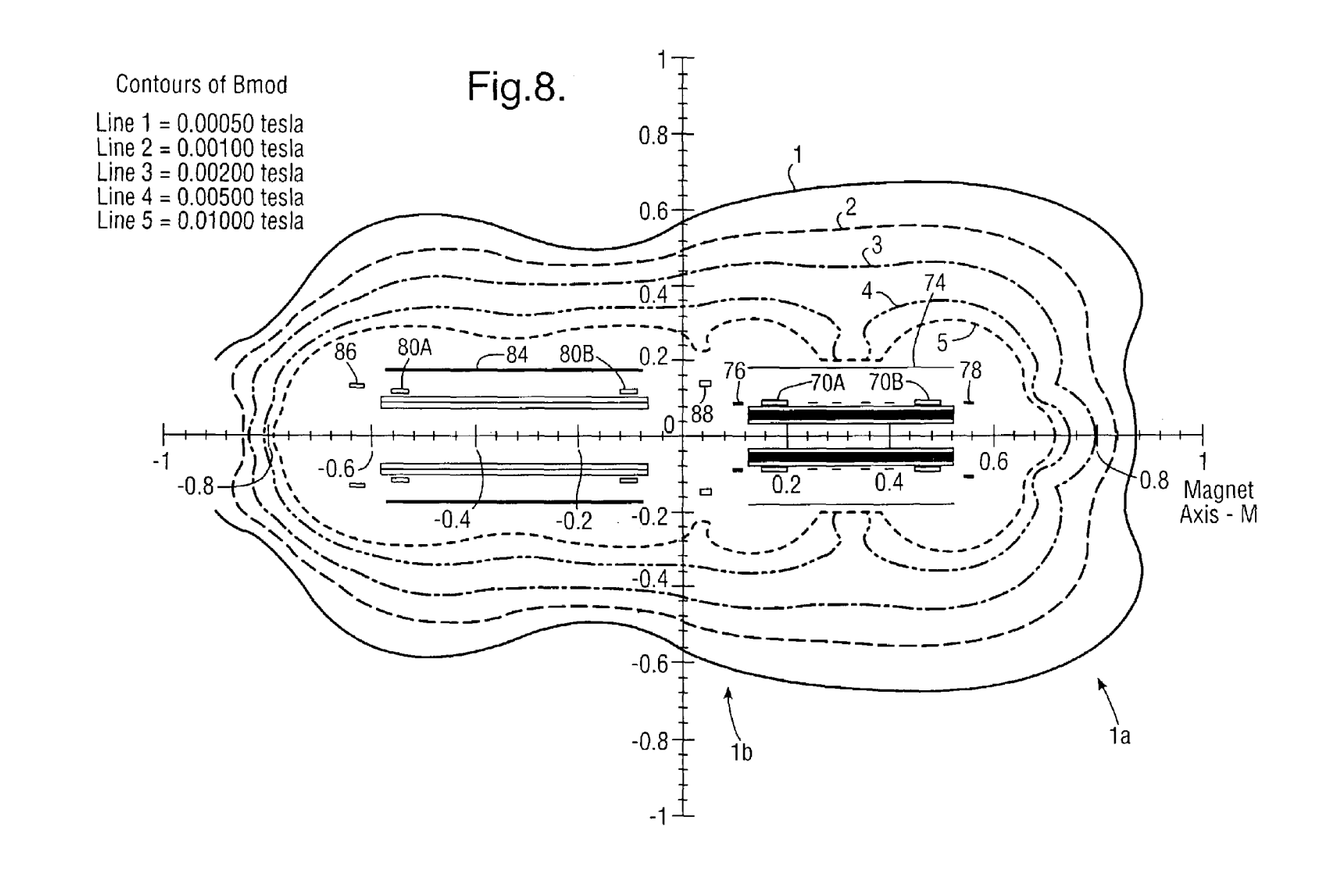
FIG. 8 is a contour map of the fringe field generated by the combined magnet assemblies in FIG. 1.

As can be seen in FIG. 6, the fringe field contour corresponding to a value of 0.00050 T of the magnet assembly 1a extends to about 0.6 metres radially and about a similar distance axially. While for the NMR magnet assembly 1b (FIG. 7) the same contour extends to about 0.7 metres radially and 0.6 metres axially. This should be contrasted with a conventional actively shielded 400/54 AS magnet in which the same contour extends to about 1 metre radially and 1.5 metres axially. The use of the end active shielding coils 76,78,86,88 has significantly reduced the fringe field. FIG. 8 shows the resultant fringe field of the combined magnet assemblies 1a,1b.

In the apparatus shown in FIGS. 1 and 2 the sample is cooled to 4.2K, the atmospheric boiling temperature of helium. It may be required to cool the sample below this temperature to achieve sufficient hyperpolarization to reach the desired SNR target. In Ardenkjaer-Larsen et al this was achieved by pumping directly on the polarization chamber, reducing the saturation vapour pressure and hence the temperature, typically to about 1.2K. However, it is desirable to keep the pressure in the polarizing region at atmospheric, thus avoiding the requirement for pressure locks in the polarization chamber neck 10. This may be conveniently achieved as shown in FIG. 3.

In FIG. 3, a separate evaporation chamber 14 is immersed in the helium in the polarization chamber 4. Helium is bled into this chamber 14, which is typically formed from a coiled tube for maximum heat transfer efficiency, via a valve (not shown) from either the main cryostat reservoir 2a or the polarization chamber helium 4a. The evaporation chamber 11 is pumped using an external pump 17 to sub-cool the sample polarizing chamber by heat exchange. This arrangement is known from prior art, and is called a lambda point refrigerator. It is typically used to sub-cool high-field magnets.

The apparatus shown in FIG. 3 conveniently allows the sample to be cooled to any temperature in the range from about 1K to 4.2K. The issues affecting the choice of polarization temperature are discussed in more detail later.

The chemical whose spectrum is to be measured is prepared (e.g.: by dissolving in a suitable solvent, mixing with a polarizing agent and a cryoprotectant) and the prepared sample 6 is placed in the container 7, within which it stays for the duration of the experiment. Ideally this container has the properties of an NMR sample tube (i.e.: it is be made from a low magnetic susceptibility glass to ensure good RF dielectric properties and minimise the perturbing effect on the homogeneous magnetic field during NMR measurement). The sample container 7 is then attached and sealed to the positioning tube 8. This may be conveniently achieved using automated sample handling equipment 9 on top of the magnet cryostat. Ideally the sample preparation/changer apparatus is within a sealed chamber 9a purged with helium gas. This avoids all possibility of air entering the magnet bore and/or polarizing chamber, where it could freeze and cause blockages. In addition, the inert helium atmosphere prevents oxidation of the sample and/or free radical polarizing agent during preparation.

The sample is then lowered into the polarizing chamber 4 by moving the whole assembly 5 by means of a linear actuator outside the magnet cryostat (not shown) attached to the sample carrier tube 8. The actuator may be powered pneumatically, hydraulically or electrically, as required, but must be suitable for operation within a magnetic field. Ideally the sample positioning rod 8 has a low thermal conductivity to minimise the heat leak during the polarizing phase. During polarization the sample is positioned within the microwave cavity 11, similar to that described in prior-art, which is positioned within the homogeneous field polarizing region 40 (FIG. 3). A magnetic flux density of ~3.35 T is preferred, but lower and higher fields (in the range 0.1 T to 6 T) may be suitable. The polarizing field region 40 requires homogeneity of ~10 ppm over the sample volume to ensure that the sample is within the ESR linewidth of the radical (typically 10 kHz). Microwave irradiation is applied for sufficient time to build adequate hyperpolarization. A solid-state NMR polarimeter (not shown) may optionally be used to monitor build-up of polarization, as described in prior-art. When an adequate level of hyperpolarization is reached (typically 70-90% of the saturation polarization, but lower levels may be adequate, as described below), the sample plus carrier tube assembly 5 is rapidly retracted from the polarization chamber until the sample container 7 is within the RF antenna 43. The solid hyperpolarized sample therefore passes out of the cold region and into the room-temperature bore 3 of the magnet cryostat 2 whilst still inside its container. As explained above, if the sample remains cold (<10K), never experiences a field less than 0.1 T, and the transfer is carried out quickly (in a second or less), very little loss of hyperpolarization occurs. The apparatus described above achieves these aims, the minimum field between the two magnets being ~0.3 T.

The RF antenna 43 is positioned within a NMR homogeneous magnetic field region 44. The NMR magnet generates a magnetic field typically between 7 T and 16 T with a homogeneity of typically 1 ppm over the sample dimensions. Room temperature shim coils may be used to fine tune the field homogeneity, as known from prior art.

The next step in the process is sample dissolution. Hot solvent is supplied to the sample via an injector tube 45 within the sample carrier tube 8. To minimise the quantity of hot solvent required, and to improve repeatability, the inner tube 45 is ideally thermally isolated from the outer tube 8. This is achieved for example by evacuating the volume between the tubes. The inner tube 45 should also have poor thermal conductance to the sample container 7, afforded by a link with high thermal impedance (e.g.: bellows) so that the inner tube does not cool too much during the polarization phase. Optionally the inner tube 45 may be rapidly heated to room temperature (or higher) immediately after the sample positioning assembly 5 has been extracted from the polarizing cryostat by means of electrical heaters (not shown). These precautions minimise the heat lost by the pressurized hot solvent that is now injected into the sample tube from a pre-heated vessel 47, via a valve 48. This in turn minimises the quantity of solvent required to raise the temperature of the sample 6 and its container 7, and to dissolve the sample and form a room temperature liquid. It is probably desirable if the sample is in the form of a "snow" or small pellets to maximise the surface area and facilitate dissolution by promoting turbulence. It is further preferable to minimise the wall thickness of the sample tube 7 to reduce its thermal capacity, consistent with the ability to survive thermal shock.

Instead of dissolution in a hot solvent the sample may be melted by direct application of heat, for example, from an infra-red heat source, laser, microwave heating, chemical exotherm, etc. This approach has the advantage of reducing the dilution of the sample, but in practice it has proven hard to melt the sample fast enough.

As soon as the sample is dissolved an NMR measurement is made. For example, a simple pulse-acquire experiment involves applying a pulse of RF at the NMR frequency of the species of interest to tip the bulk magnetization into the transverse plane, and then measure its free induction decay (FID). Typically the same antenna is used for transmit and receive, but separate antennas are possible, as are many other options known to those skilled in the art. RF electronics for applying RF pulses and acquiring the NMR signal, as known from prior-art are required, but not shown in the diagrams. The FID may be subsequently Fourier transformed, using a computer, to provide a spectrum, each peak in the spectrum corresponding to a different chemical shift and structural bond in the compound under study. The spectrum may be interpreted to reveal information on the structure of the molecule. However, it should be noted that a DNP-NMR spectrum will contain features associated with the non-equilibrium nature of the measurement compared to conventional NMR, so some new interpretation techniques are required. For example the decay rate of hyperpolarization (T1) depends on the chemical environment of the nucleus, hence the relative amplitude of the various spectral lines will depend on the speed at which dissolution, sample transfer and subsequent measurement is carried out. This effect emphasises the need for apparatus to make a reproducible measurement, as provided by the present invention. Despite these differences DNP-NMR data is of great value in the confirmation and elucidation of chemical structures. Under many circumstances this information could not have been collected from the same sample by conventional NMR within the same time frame, as is described below.

After NMR measurement the sample carrier assembly 5 is retracted fully from the magnet bore into the sample preparation area 9, the sample container 7 is disconnected from the sample carrier rod 8, and either discarded or cleaned in preparation for a new sample. The process is then repeated.

The designer of a DNP-NMR instrument must balance the requirement for increased SNR against several other factors, such as the sample throughput rate and instrument cost/complexity, etc. The increased SNR may be utilised in a number of ways:

to reduce the minimum required quantity of sample compared to conventional NMR
 to reduce the total measurement time
 to enable measurement of low concentration samples (e.g.: to study trace materials in body fluids)
 a combination of the above For example, a conventional 14 T NMR magnet can collect a $^{13}C$ spectrum from a few hundred microgrammes of small molecule organic sample in a timescale of the order of hours (e.g.: 15-30 minutes for a modern system fitted with a cryoprobe, to several hours for a system with older electronics). The same hardware would require from several days or weeks to collect a $^{15}N$ spectrum from the same sample, due to the inherently low sensitivity of natural abundance nitrogen (about 44 times less than carbon, which itself is 5680 times less than proton). For this reason, carbon spectra are acquired infrequently, and nitrogen spectra almost never. The measurement time can be reduced by enriching the sample so that it has a higher proportion of non-integer spin nuclei than the natural abundance (~1% for carbon and ~0.37% for nitrogen), but this is very expensive and rarely carried out. Commercial DNP-NMR hardware should allow a $^{13}C$ spectrum of similar quality to be achieved in minutes, and a $^{15}N$ spectrum in hours, from a much smaller quantity of sample (from 10 to 100 times less).

To predict the performance, a mathematical model of the DNP-NMR process may be developed, based on theory and experimental observations. The model predicts the approximate SNR achieved in practice. This is linked to a many factors, including polarization time, polarization temperature, applied microwave power, sample movement delays, sample characteristics, etc. Optimizing the design requires a good understanding of these factors and their interaction. In a conventional NMR system the sample's magnetization is at room-temperature equilibrium (magnetization being the term typically used for bulk polarization). The weak thermal magnetization is destroyed by the NMR measurement. However the thermal polarization recovers rapidly (in a few seconds) after each pulse-acquire measurement, and hence averaging of a large number of sequential measurements is routinely employed in conventional NMR. Averaging increases SNR, which grows in proportion to the square-root of the number of averages, (as signal is correlated between measurements, whilst noise is not).

In contrast, the total measurement time in the DNP-NMR experiment is dominated by the duration of the hyperpolarization period, which is typically between tens of minutes and hours in the prior-art. This means that signal averaging cannot practically be employed and the NMR data must be acquired in a single pulse sequence (or "single-shot" experiment). The level of hyperpolarization must therefore be large enough that the single-shot SNR is still significantly higher than the time averaged SNR which could have been achieved by putting the same sample in a conventional NMR system and signal averaging for the same duration as the total DNP measurement time.

In the prior-art the polarization is carried out at about 1.2K to maximise the hyperpolarization of the sample. This is useful in a development system, and especially when the application is in-vivo DNP-MRI (in which the hyperpolarized liquid is injected into a living human or animal which is then imaged in a conventional MRI magnet, providing signal contrast. In this application maximum polarization will result in the longest possible imaging time). In the present invention, where a small sample is to be measured in-vitro, a minimum single-shot SNR is required in the final spectrum. This is typically about 5:1 for the smallest peak (i.e.: the rarest bond) in the spectrum. Any "excess" SNR can be traded off against other factors to optimise the system design. For example, it may be possible to polarize the sample for a shorter time, hence speeding through-put of subsequent samples.

All of the embodiments described above allow the sample to be polarized at 4.2K. This is warmer than the polarizing temperature used in prior-art.

A preferred trade-off not explicitly described in the prior-art is to increase the polarization temperature from ~1K to about 4.2K. The ratio of the absolute polarization achieved after any given interval will depend on the precise dependence of saturation polarization ($P_{sat}$) and build-up time constant ($\tau$) to temperature (T):

$$P_{sat} \propto 1/T^a \text{ and } \tau \propto 1/T^b$$

Figure 9:
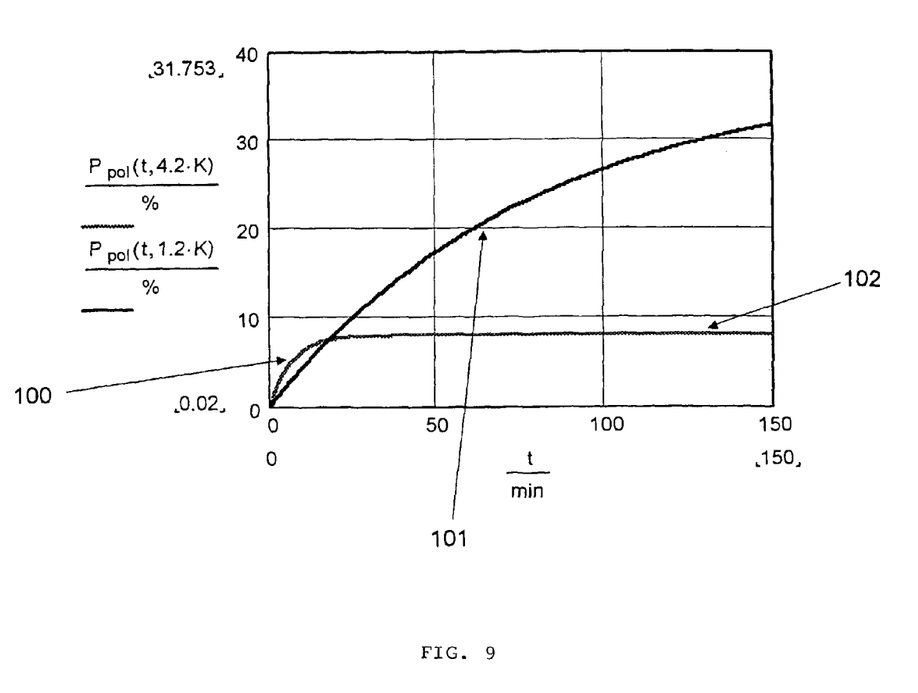
FIG. 9 illustrates hyperpolarization build-up curves at different temperatures; and, FIG. 10 illustrates the variation of magnetic field along the bore of a further example.

If b>a the net polarization at the higher temperature will initially outstrip that at lower temperature, although it will always be eventually overtaken by the lower temperature experiment if the total polarization time is long enough. This is illustrated in FIG. 9. It is expected from naive theory that a~1 and b~2 (as T is expected to be proportional to T1), and so b>a. As previously explained it is desirable to keep the polarization time short (e.g.: <15 mins). After this short time it is likely that the polarization at 4.2K (100) would be substantially larger than the polarization at 1.2K 101, as shown in FIG. 5, although neither would be at the saturation level (102 for 4.2K). If the hyperpolarization has built to a level that provides sufficient SNR for a measurement on a particular sample (after which there is little point in polarizing for longer), then we have an additional advantage to operation at 4.2K over operation at a lower temperature. It remains to be seen if this theoretical result is borne out in practice. Experiments to measure the ratio of hyperpolarization at 4.2K and 1.2K as a function of time are required to elucidate the values of factors a and b.

In summary, the examples of the invention disclosed above improves upon prior-art DNP-NMR hardware in the following ways:

1) A pair of tightly actively shielded magnets that can be positioned in close proximity to create homogeneous magnetic fields regions of a size and flux density suitable for DNP and NMR processes, sufficiently closely spaced and with a minimum field value >0.1 T so that a frozen sample does not de-polarize significantly when moved quickly between the regions.

2) A substantial improvement in cryogenic efficiency is achieved by moving the sample out of the polarizing cryostat into a room temperature region within the bore of the magnet system, but still in a strong magnetic field region, before dissolving it.

3) There is a possible advantage to polarizing the sample at 4.2K rather than a lower temperature. This removes the requirement for a low temperature refrigerator, and potentially increases the hyperpolarization achieved with the short polarization times that are preferred for high sample throughput.

In the examples described above, two separate magnet assemblies have been used to produce the DNP and NMR working regions respectively. It is also possible to utilise a single magnet assembly to create two or more working volumes within the envelope of the assembly. Our application WO 04/029645 provides methods for designing a magnet assembly with one central homogenous zone and two zones outside the ends of the bore. An example is set out in Table 1 below which has five saddle points in the bore.

TABLE 1

| Coil | a1 (cm) | a2 (cm) | b1 (cm) | b2 (cm) | turns | Current (A) |
|---|---|---|---|---|---|---|
| 1 | 5.35 | 5.958 | −15 | 15 | 10912 | 598.246 |
| 2 | 7 | 7.228 | −13.848 | −10.9 | 402 | 598.086 |
| 3 | 7 | 7.228 | 10.9 | 13.848 | 402 | 598.086 |
| 4 | 7.1 | 7.138 | 7.35 | 8.494 | −26 | −598.086 |
| 5 | 7.1 | 7.138 | −8.494 | −7.35 | −26 | −598.086 |
| 6 | 11.1 | 11.252 | −28 | 28 | −5093 | −598.288 |
| 7 | 5.35 | 6.511 | 19.9 | 25.1 | 3610 | 598 |
| 8 | 5.35 | 6.511 | −25.1 | −19.9 | 3610 | 598 |

Figure 10:
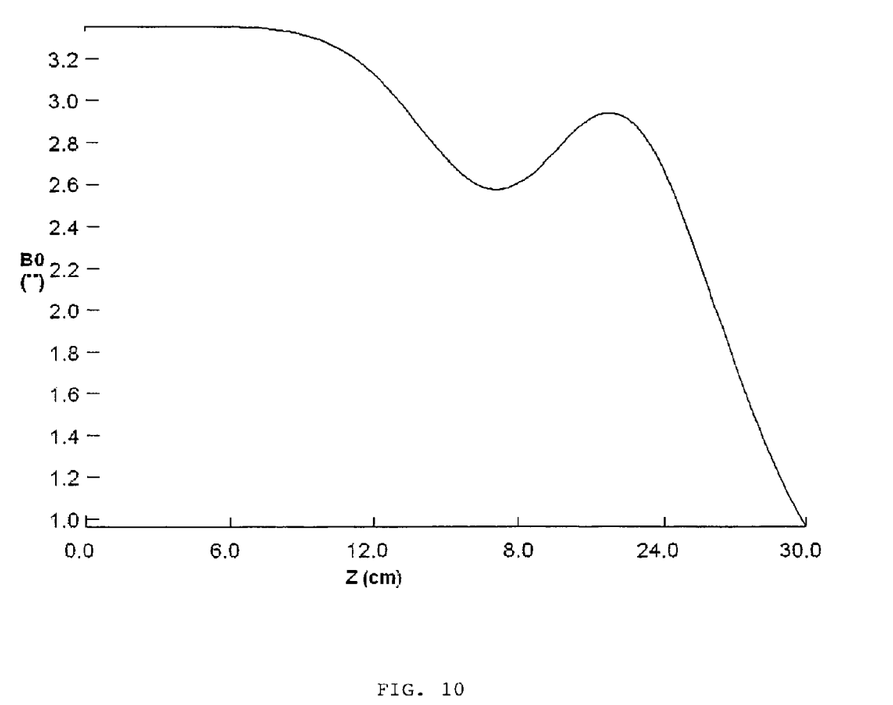

FIG. 10 shows the field along the bore within the magnet (z=0 to z=30 cm).

This design provides the necessary homogeneity over a small volume; the central region is very homogeneous for carrying out NMR on the sample. The two outer DSVs or working volumes (~2.6 T at z~17 cm and ~2.9 T at z~24 cm) are small, but could be used for polarising.

The invention claimed is:

1. Apparatus for performing in-vitro DNP-NMR measurements on a sample, the apparatus comprising magnetic field generating apparatus located in a cryostat and surrounding a bore defining respective NMR and DNP working regions; a system for performing DNP on a suitably prepared sample in the DNP working region; a system for performing a NMR process on a sample in the NMR working region; a sample positioning mechanism which can be inserted in the bore to bring a sample in turn into each of the working regions, the magnetic field generating apparatus being suitably structured so that the magnetic field in the DNP working region has a homogeneity or profile suitable for performing DNP on the sample and the magnetic field in the NMR working region has a homogeneity or profile suitable for performing a NMR process on the sample, characterized in that the magnetic field generating apparatus comprises a pair of magnet assemblies located in the cryostat and surrounding respective, coaxial bores so as to define the corresponding NMR and DNP working regions in the bores, wherein the magnet assemblies are suitably shielded so that the magnetic field in the DNP working region has a homogeneity or profile suitable for performing DNP on the sample and the magnetic field in the NMR working region has a homogeneity or profile suitable for performing a NMR process on the sample.

2. Apparatus according to claim 1, wherein each magnet assembly is either actively or passively shielded.

3. Apparatus according to claim 1, wherein at least one magnet assembly has end shielding coils.

4. Apparatus according to any of claims 1, where at least one of the magnet assemblies are protected under a single resistor.

5. Apparatus according to claim 1, further comprising coolant in the DNP working region.

6. Apparatus according to claim 5, wherein the coolant comprises liquid helium.

7. Apparatus according to claim 5, wherein the DNP working region is coupled for coolant communication with a coolant containing vessel of the cryostat.

8. Apparatus according to claim 7, further comprising a valve for controlling coolant flow between the coolant containing vessel and the DNP working region.

9. Apparatus according to claim 5, wherein the DNP working region is defined within an additional cryostat located within the bore of the magnetic field generating apparatus.

10. Apparatus according to claim 9, further comprising a lambda point refrigerator located in the additional cryostat.

11. Apparatus according to claim 1, wherein the NMR working region is located in a bore substantially at room temperature.

12. Apparatus according to claim 1, wherein the magnetic field generating apparatus generates a field in the DNP working region of up to 4 T.

13. Apparatus according to claim 1, wherein the magnetic field generating apparatus generates a field in the NMR working region exceeding 5 T.

14. Apparatus according to claim 1, wherein the centres of the working regions are spaced apart by less than 1 m.

15. A method of carrying out an in-vitro DNP-NMR experiment, the method comprising:
providing an apparatus having: magnetic field generating apparatus located in a cryostat and surrounding a bore defining respective NMR and DNP working regions; a system for performing DNP on a suitably prepared sample in the DNP working region; a system for performing a NMR process on a sample in the NMR working region; a sample positioning mechanism which can be inserted in the bore to bring a sample in turn into each of the working regions, the magnetic field generating apparatus being suitably structured so that the magnetic field in the DNP working region has a homogeneity or profile suitable for performing DNP on the sample and the magnetic field in the NMR working region has a homogeneity or profile suitable for performing a NMR process on the sample, wherein the magnetic field generating apparatus comprises a pair of magnet assemblies located in the cryostat and surrounding respective, coaxial bores so as to define the corresponding NMR and DNP working regions in the bores, wherein the magnet assemblies are suitably shielded so that the magnetic field in the DNP working region has a homogeneity or profile suitable for performing DNP on the sample and the magnetic field in the NMR working region has a homogeneity or profile suitable for performing a NMR process on the sample;
preparing the sample for the DNP process;
using the sample positioning mechanism to insert the sample into the DNP working region;
carrying out DNP on the sample;
using the sample positioning mechanism rapidly to transfer the sample to the NMR working region; and
dissolving the sample in the solvent or melting the sample and performing an NMR measurement on the sample.

16. Apparatus according to claim 1, wherein the magnetic field generating apparatus generates a field in the DNP working region of about approximately 3.5K.

17. Apparatus according to claim 1, wherein the magnetic field generating apparatus generates a field in the NMR working region about approximately 7-10 T.

18. Apparatus according to claim 1, wherein the centres of the working regions are spaced apart by about approximately 0.5 m.

* * * * *